US008613979B2

(12) United States Patent
Maghsoodi et al.

(10) Patent No.: US 8,613,979 B2
(45) Date of Patent: Dec. 24, 2013

(54) BORON-CONTAINING HYDROGEN SILSESQUIOXANE POLYMER, INTEGRATED CIRCUIT DEVICE FORMED USING THE SAME, AND ASSOCIATED METHODS

(71) Applicant: Cheil Industries, Inc., Uiwang-si (KR)

(72) Inventors: Sina Maghsoodi, San Jose, CA (US); Shahrokh Motallebi, Los Gatos, CA (US); SangHak Lim, San Jose, CA (US); Meisam Movassat, Atherton, CA (US); Do-Hyeon Kim, San Jose, CA (US)

(73) Assignee: Cheil Industries, Inc., Uiwang-si (KR)

( * ) Notice: Subject to any disclaimer, the term of this patent is extended or adjusted under 35 U.S.C. 154(b) by 0 days.

(21) Appl. No.: 13/732,990

(22) Filed: Jan. 2, 2013

(65) Prior Publication Data
US 2013/0115751 A1    May 9, 2013

Related U.S. Application Data

(63) Continuation of application No. 12/458,926, filed on Jul. 28, 2009, now Pat. No. 8,349,985.

(51) Int. Cl.
*B05D 5/12* (2006.01)
*B05D 3/02* (2006.01)

(52) U.S. Cl.
USPC ............. 427/387; 216/13; 528/31; 528/394; 528/481; 427/96.1; 427/98.4; 427/99.2; 427/99.3

(58) Field of Classification Search
None
See application file for complete search history.

(56) References Cited

U.S. PATENT DOCUMENTS

| | | | |
|---|---|---|---|
| 4,973,526 A | 11/1990 | Haluska | |
| 5,387,364 A | 2/1995 | Nedelec et al. | |
| 6,278,174 B1 | 8/2001 | Havemann et al. | |
| 6,316,833 B1 | 11/2001 | Oda | |
| 6,693,050 B1 | 2/2004 | Cui et al. | |
| 6,706,646 B1 | 3/2004 | Lee et al. | |
| 6,716,952 B1 | 4/2004 | Matsumoto et al. | |
| 6,967,172 B2 | 11/2005 | Leung et al. | |
| 7,989,030 B2 | 8/2011 | Boisvert et al. | |
| 2002/0034884 A1 | 3/2002 | Whitman et al. | |
| 2003/0006476 A1 | 1/2003 | Chen et al. | |
| 2004/0070023 A1 | 4/2004 | Kim et al. | |
| 2004/0110346 A1 | 6/2004 | Tao | |
| 2004/0248374 A1 | 12/2004 | Belyansky et al. | |
| 2004/0262661 A1 | 12/2004 | Kim et al. | |
| 2008/0249275 A1 | 10/2008 | Lichtenhan et al. | |

FOREIGN PATENT DOCUMENTS

WO   WO 2004/101840 A1   11/2004
WO   WO 2006/138055 A2   12/2006

OTHER PUBLICATIONS

"Preparation and Properties of Borosiloxane Gels" authored by Wang et al. and published in the Journal of Applied Polymer Science (2006) 99, 719-724.*

"Boron, Aluminum and Gallium Silsesquioxane Compounds, Homogeneous Models for Group 13 Element—Containing Silicates and Zeolites" authored by Gerritsen et al. and published in Organometallics (2003), 22, 100-110.*

"Synthesis, Reactivity, and Dynamic Behavior of a Boron-Containing Silsesqioxane" authored by Feher et al. and published in Inorganic Chemistry (1992) 31, 5100-5105.*

* cited by examiner

*Primary Examiner* — Marc Zimmer
(74) *Attorney, Agent, or Firm* — Christie, Parker & Hale, LLP

(57) ABSTRACT

A composition includes a boron-containing hydrogen silsesquioxane polymer having a structure that includes: silicon-oxygen-silicon units, and oxygen-boron-oxygen linkages in which the boron is trivalent, wherein two silicon-oxygen-silicon units are covalently bound by an oxygen-boron-oxygen linkage therebetween.

19 Claims, 4 Drawing Sheets

Structure 1:

FIG. 4

Table 1:

| | Toluene (g) | H$_2$SO$_4$ (g) | Phase Transfer Catalyst (g) | HSiCl$_3$ (g) | HSiCl$_3$ (mmol) | BCl$_3$ (g)* | BCl$_3$ (mmol) | Toluene (g) | Mw | PD |
|---|---|---|---|---|---|---|---|---|---|---|
| Ex. 1 (BO$_{3/2}$)$_{0.01}$(HSiO$_{3/2}$)$_{0.99}$ | 180 | 75.0 | 1.0 | 60 | 443 | 3.8 | 4.3 | 180 | 17,550 | 3.14 |
| Ex. 2 (BO$_{3/2}$)$_{0.0175}$(HSiO$_{3/2}$)$_{0.9825}$ | 540.0 | 225.0 | 1.0 | 171.0 | 1,260 | 20.4 | 22.5 | 540.0 | 9,145 | 2.44 |
| Ex. 3 (BO$_{3/2}$)$_{0.02}$(HSiO$_{3/2}$)$_{0.98}$ | 180 | 75.0 | 1.0 | 60 | 443 | 7.7 | 8.4 | 180.0 | 14,330 | 2.83 |
| Ex. 4 (BO$_{3/2}$)$_{0.03}$(HSiO$_{3/2}$)$_{0.97}$ | 180 | 75.0 | 1.0 | 58 | 428 | 11.5 | 12.6 | 180 | 9,700 | 2.44 |
| Ex. 5 (BO$_{3/2}$)$_{0.05}$(HSiO$_{3/2}$)$_{0.95}$ | 540.0 | 225.0 | 1.0 | 171.0 | 1,260 | 60.4 | 66 | 540.0 | 8,200 | 2.37 |

* Grams of a 1M solution of BCl$_3$ in toluene

Table 2:

| | Film Shrinkage** | Relative Wet Etch Rate[†,††] |
|---|---|---|
| Ex. 7 (1 mol% boron oxide) | 10% | 1.42 |
| Ex. 8 (2 mol% boron oxide) | 7% | 1.49 |
| Ex. 9 (3 mol% boron oxide) | 10% | 1.43 |
| Ex. 10 (5 mol% boron oxide) | 9% | 1.36 |
| Comp. Ex. (polysilazane) | 18% | 1.50 |

** Cured at 800 °C in H$_2$O/O$_2$ atmosphere
[†] Wet etch rate relative to SiO$_2$ produced via thermal oxidation
[††] Etchant used for Ex. 7-10 was 1:50; etchant used for Comp. Ex. was 1:100

BORON-CONTAINING HYDROGEN SILSESQUIOXANE POLYMER, INTEGRATED CIRCUIT DEVICE FORMED USING THE SAME, AND ASSOCIATED METHODS

CROSS-REFERENCE TO RELATED APPLICATION

This application is a continuation of and claims priority to and the benefit of U.S. application Ser. No. 12/458,926 (now U.S. Pat. No. 8,349,985), filed on Jul. 28, 2009, the entire content of which is incorporated herein by reference.

BACKGROUND OF THE INVENTION

1. Field of the Invention

Embodiments relate to a boron-containing hydrogen silsesquioxane polymer, an integrated circuit device formed using the same, and associated methods.

2. Description of the Related Art

The manufacture of an integrated circuit device may include the formation of insulating structures. For example, active regions may be defined in a semiconductor substrate by forming isolation structures on and/or in the substrate, the isolation structures including, or being made of, an electrically insulating material. As another example, an electrically insulating layer may be formed on the substrate, e.g., between underlying and overlying conductive structures. It may be important that such insulating structures be formed conformally and/or so as to fill gaps. However, existing approaches for forming such insulating structures are either expensive, e.g., chemical vapor deposition (CVD), or require the use of materials that generate undesirable by-products, such as current polysilazane spin-on materials.

SUMMARY OF THE INVENTION

Embodiments are directed to a boron-containing hydrogen silsesquioxane polymer, an integrated circuit device formed using the same, and associated methods, which substantially overcome one or more of the problems due to the limitations and disadvantages of the related art.

It is therefore a feature of an embodiment to provide a composition that may be spun on a substrate to form an insulating structure.

It is therefore another feature of an embodiment to provide a composition that may be used to form an insulating structure while reducing or eliminating the emission of unwanted byproducts.

At least one of the above and other features and advantages may be realized by providing a composition, including a boron-containing hydrogen silsesquioxane polymer having a structure that includes: silicon-oxygen-silicon units, and oxygen-boron-oxygen linkages in which the boron is trivalent. Two silicon-oxygen-silicon units may be covalently bound by an oxygen-boron-oxygen linkage therebetween.

Boron may be present in the boron-containing hydrogen silsesquioxane polymer in an amount of about 0.5 to about 5 mol %.

The boron-containing hydrogen silsesquioxane polymer may have a cage structure or a partial cage structure. For example, the boron-containing hydrogen silsesquioxane polymer may include a first unit having a cage structure or a partial cage structure and being formed of silicon-oxygen-silicon bonds, and a second unit having a cage structure or a partial cage structure and being formed of silicon-oxygen-silicon bonds, where the first and second units are linked by an oxygen-boron-oxygen linkage covalently bonded to a silicon atom of the first unit and a silicon atom of the second unit.

The boron-containing hydrogen silsesquioxane polymer may be substantially free of carbon.

The boron-containing hydrogen silsesquioxane polymer may be substantially free of nitrogen.

The composition may further include a solvent.

At least one of the above and other features and advantages may also be realized by providing a method of fabricating an integrated circuit, the method including providing a substrate for the integrated circuit, coating a composition on the substrate, and after coating the composition on the substrate, curing the composition. The composition may include a boron-containing hydrogen silsesquioxane polymer having a structure that includes: silicon-oxygen-silicon units, and oxygen-boron-oxygen linkages in which the boron is trivalent. Two silicon-oxygen-silicon units may be covalently bound by an oxygen-boron-oxygen linkage therebetween.

Curing the composition may include heating the substrate having the composition thereon in an oxidizing atmosphere.

Curing the composition may include heating the substrate having the composition thereon in an inert atmosphere.

Curing the composition on the substrate may cause curing byproducts to be emitted from the polymer, the curing byproducts being substantially free of nitrogen.

The method may further include forming a trench in a surface of the substrate before coating the composition thereon, filling the trench with the composition, and curing the composition in the trench. A shallow trench isolation structure may be formed by curing the composition in the trench.

Curing the composition in the trench may include heating the substrate at a temperature of about 900° C. to about 1,100° C.

An interlayer dielectric layer may be formed by curing the composition on the substrate.

Curing the composition on the substrate may include heating the substrate at a temperature of about 400° C. to about 700° C.

At least one of the above and other features and advantages may also be realized by providing a method of synthesizing a boron-containing hydrogen silsesquioxane polymer having covalently bound trivalent boron therein, the method including providing a liquid system having a phase transfer catalyst and first and second phases, the first phase including sulfuric acid and the second phase including an organic solvent, adding to the liquid system a solution containing an organic solvent, trichlorosilane, and at least one of boron trichloride, boron triiodide, boron tribromide, a trialkyl borate, or boric acid.

The organic solvent in the second phase and the organic solvent in the solution may be the same.

The organic solvent in the second phase and the organic solvent in the solution may be different from each another.

The second phase of the liquid system may be maintained below a temperature of about 40° C. during the addition of the solution thereto.

BRIEF DESCRIPTION OF THE DRAWINGS

The above and other features and advantages will become more apparent to those of skill in the art by describing in detail example embodiments with reference to the attached drawings, in which:

FIG. 4 illustrates Tables 1 and 2 showing components and resulting characteristics of Examples and a Comparative Example.

DETAILED DESCRIPTION OF THE INVENTION

Figure 1A:
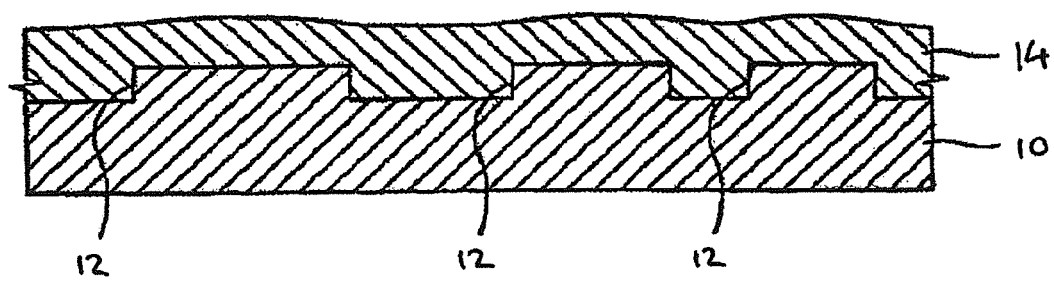
FIGS. 1A through 1C illustrate stages in a method of forming an integrated circuit device using a boron-containing hydrogen silsesquioxane polymer according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a solvent" may represent a single compound, e.g., toluene, or multiple compounds in combination, e.g., toluene mixed with dichloromethane.

As used herein, molecular weights of polymeric materials are weight average molecular weights, unless otherwise indicated.

Figure 1B:
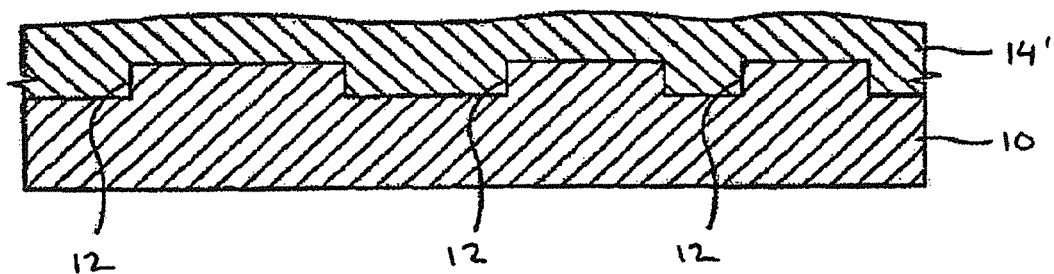
Figure 1C:
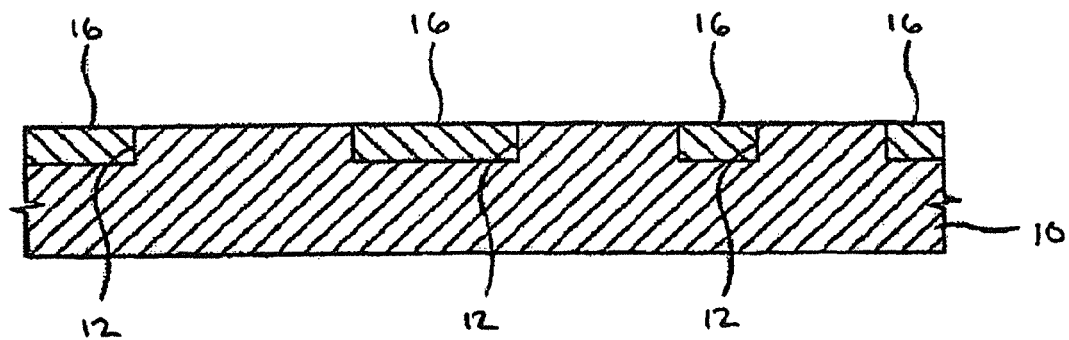

FIGS. 1A through 1C illustrate stages in a method of forming an integrated circuit device using a boron-containing hydrogen silsesquioxane polymer according to an embodiment.

Referring to FIG. 1A, trenches 12 may be formed in a substrate 10, which may be, e.g., a substrate formed of a semiconductor material such as silicon. The trenches 12 may be used to form isolation structures, e.g., shallow trench isolation (STI), structures that define active regions of the substrate 10. After forming the trenches 12, a composition including the boron-containing hydrogen silsesquioxane polymer according to an embodiment may be applied to the substrate 10, e.g., using a spin-on process, to form a layer 14 that includes the boron-containing hydrogen silsesquioxane polymer.

Referring to FIG. 1B, the layer 14 may be thermally processed to form a boron-containing silicon oxide layer 14'. The thermal processing may include, e.g., an oxidative curing operation in which the substrate 10 having the layer 14 is first soft-baked at a relatively low temperature, and then cured at a higher temperature to generate the boron-containing silicon oxide layer 14' from the boron-containing hydrogen silsesquioxane polymer.

Referring to FIG. 1C, after curing, the boron-containing silicon oxide layer 14' may be planarized, e.g., using a chemical mechanical polishing (CMP) process. The planarization may form boron-containing silicon oxide isolation structures 16, e.g., STI structures, in the trenches 12.

Figure 2A:
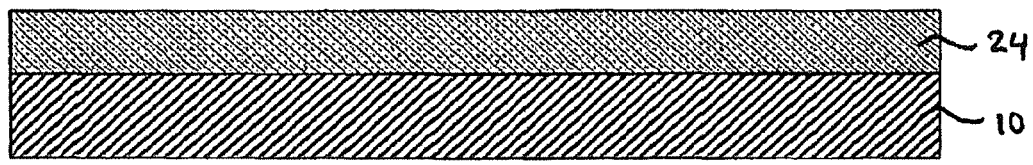
FIGS. 2A and 2B illustrate stages in another method of forming an integrated circuit device using a boron-containing hydrogen silsesquioxane polymer according to an embodiment.
Figure 2B:

FIGS. 2A and 2B illustrate stages in another method of forming an integrated circuit device using a boron-containing hydrogen silsesquioxane polymer according to an embodiment.

Referring to FIG. 2A, a composition including the boron-containing hydrogen silsesquioxane polymer according to an embodiment may be applied to the substrate 10, e.g., using a spin-on process, to form a layer 24 that includes the boron-containing hydrogen silsesquioxane polymer.

Referring to FIG. 2B, the layer 24 may be thermally processed to form a boron-containing silicon oxide inter layer dielectric (ILD) layer 24'. The thermal processing may include, e.g., an oxidative curing operation in which the substrate 10 having the layer 24 is first soft-baked at a relatively low temperature, and then cured at a higher temperature to generate the boron-containing silicon oxide ILD layer 24' from the boron-containing hydrogen silsesquioxane polymer. After curing, the boron-containing silicon oxide layer 24' may be planarized, e.g., using a CMP process.

In forming the ILD layer 24', which may be, e.g., a pre-metal dielectric (PMD) or an inter-metal dielectric (IMD) layer, the maximum curing temperature may be about 400° C. to about 700° C. In contrast, for STI structures like the boron-containing silicon oxide isolation structures 16 in FIG. 1C, the maximum curing temperature may be about 900° C. to about 1,100° C.

Figure 3:
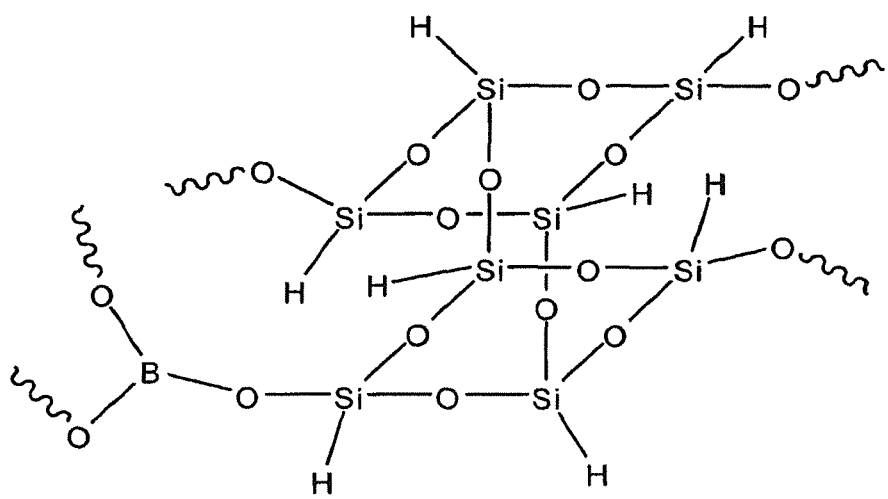
FIG. 3 illustrates Structure 1, a boron-containing hydrogen silsesquioxane polymer according to an embodiment.

FIG. 3 illustrates Structure 1, a boron-containing hydrogen silsesquioxane polymer according to an embodiment. In Structure 1, wavy lines extending from oxygen atoms are shorthand notations indicating further portions of the polymer.

The boron-containing hydrogen silsesquioxane polymer may have a structure that includes silicon-oxygen-silicon units, and further including oxygen-boron-oxygen linkages in which the boron is trivalent. In the polymer, two silicon-oxygen-silicon units may be covalently bound by an oxygenboron-oxygen linkage therebetween. The boron-containing hydrogen silsesquioxane polymer may have a cage structure or a partial cage structure. For example, as shown in FIG. 3, the boron-containing hydrogen silsesquioxane polymer may include a first unit having a cage structure or a partial cage structure and being formed of silicon-oxygen-silicon bonds, and a second unit having a cage structure or a partial cage structure and being formed of silicon-oxygen-silicon bonds, where the first and second units are linked by an oxygen-boron-oxygen linkage covalently bonded to a silicon atom of the first unit and a silicon atom of the second unit. The boron-containing hydrogen silsesquioxane polymer may have a molecular weight of about 1,500 Daltons to about 30,000 Daltons.

The boron-containing hydrogen silsesquioxane polymer may consist of, or consist essentially of, boron, hydrogen, silicon, and oxygen. The boron-containing hydrogen silsesquioxane polymer according to an embodiment may include about 0.5 mol % to about 5 mol % of boron. In an implementation, the boron-containing hydrogen silsesquioxane polymer may be free of, or substantially free of, carbon. In an implementation, the boron-containing hydrogen silsesquioxane polymer may be free of, or substantially free of, nitrogen.

During the manufacture of an integrated circuit device, a composition including the boron-containing hydrogen silsesquioxane polymer according to an embodiment may be deposited on a substrate by, e.g., spin-coating. The use of such a spin-on process may be very economical as compared to, e.g., CVD. Further, spin-coating the composition including the boron-containing hydrogen silsesquioxane polymer according to an embodiment may be very effective to fill high-aspect ratio gaps, vias, trenches, etc.

Following deposition, the composition including the boron-containing hydrogen silsesquioxane polymer according to an embodiment may be cured to form a dense, electrically insulating material. The boron in the skeleton of the boron-containing hydrogen silsesquioxane polymer may act as a sintering aid, helping to make the cured film dense and aiding gap filling. The insulating material may have a high dielectric constant. The insulating material may form, e.g., an STI structure, an ILD layer, etc.

Curing may result in the emission of hydrogen and water as the primary, or only, byproducts. Accordingly, curing may result in substantially fewer and/or less-hazardous byproducts than would result from curing of, e.g., a polysilazane, which may emit or outgas nitrogen-containing byproducts such as ammonia.

In an embodiment, the boron-containing hydrogen silsesquioxane polymer according to an embodiment may be prepared using, e.g., trichlorosilane and one or more of, e.g., boron trichloride, boron triiodide, boron tribromide, a trialkyl borate, or boric acid. A general synthetic procedure for forming the polymer may include providing a liquid system having a phase transfer catalyst and first and second phases. The first phase may be a lower phase that includes sulfuric acid, and the second phase may be an upper phase that includes a relatively non-polar organic solvent. To the liquid system may be added a solution containing the trichlorosilane, and the boron trichloride, boron triiodide, a trialkyl borate, and/or boric acid. The solution may include an organic solvent, e.g., a relatively non-polar organic solvent, that dissolves the trichlorosilane, and the boron trichloride, boron triiodide, a trialkyl borate, and/or boric acid. The organic solvent used for the solution and that used for the second phase may be the same or different.

In an implementation, the synthetic procedure for forming the boron-containing hydrogen silsesquioxane polymer may include providing a jacketed reactor and adding thereto toluene (as the organic solvent), sulfuric acid, and a phase transfer catalyst. The resulting mixture may be stirred for, e.g., 30 minutes (30 min). Then, the trichlorosilane and boron precursor (i.e., boron trichloride, boron triiodide, a trialkyl borate, boric acid, etc.), combined in an organic solvent such as toluene, may be added dropwise to the jacketed reactor having the toluene, sulfuric acid, and phase transfer catalyst therein.

Below, five example preparations are described in detail. The components and characteristics of the resultant boron-containing hydrogen silsesquioxane polymers are set forth in Table 1 in FIG. 4.

EXAMPLE 1

Synthesis of $(BO_{3/2})_{0.01}(HSiO_{3/2})_{0.99}$

In a first example preparation, a boron-containing hydrogen silsesquioxane polymer according to an embodiment was prepared as follows. In a 3.0 L jacketed reactor, toluene (180 g), sulfuric acid (92-96%; 75.0 g), and a phase transfer catalyst (1.0 g) were combined and the resulting mixture was stirred for 30 min at room temperature under a nitrogen atmosphere. Then, a mixture of trichlorosilane (60 g, 443 mmoles), boron trichloride (3.8 g of a 1.0 molar (M) solution in toluene; 4.3 mmoles), and toluene (180.0 g) was added dropwise to the mixture in the jacketed reactor. The duration of the dropwise addition was 5 hours. The temperature was kept below 40° C. during the dropwise addition. Once the addition was completed, the mixture was stirred for another hour. The stirring was then stopped and the lower phase was separated from the upper phase. The lower phase was discarded. The upper phase (toluene phase) was washed with water (five washes using 300 g of water each) and then dried over magnesium sulfate. The dried toluene phase was then filtered and then a portion of the toluene was removed under vacuum to produce a 10% solution of the boron-containing hydrogen silsesquioxane polymer in toluene, i.e., the resulting solution included 10% by weight of the polymer. The molecular weight (Mw) of the boron-containing hydrogen silsesquioxane polymer was determined to be 17,550 and the polydispersity (PD) of the boron-containing hydrogen silsesquioxane polymer was determined to be 3.14, both by gel permeation chromatography (GPC).

EXAMPLE 2

Synthesis of $(BO_{3/2})_{0.0175}(HSiO_{3/2})_{0.9825}$

In a second example preparation, a boron-containing hydrogen silsesquioxane polymer according to an embodiment was prepared as follows. In a 3.0 L jacketed reactor, toluene (540.0 g), sulfuric acid (92-96%; 225.0 g), and a phase transfer catalyst (1.0 g) were combined and the resulting mixture was stirred for 30 min at room temperature under a nitrogen atmosphere. Then, a mixture of trichlorosilane (171.0 g, 1.26 moles), boron trichloride (20.4 g of a 1.0 M solution in toluene; 22.5 mmoles), and toluene (540.0 g) was added dropwise to the mixture in the jacketed reactor. The duration of the dropwise addition was 5 hours. The temperature was kept below 40° C. during the dropwise addition. Once the addition was completed, the mixture was stirred for another hour. The stirring was then stopped and the lower phase was separated from the upper phase. The lower phase was discarded. The upper phase (toluene phase) was washed with water (five washes using 1,000 g of water each) and then dried over magnesium sulfate. The dried toluene phase was then filtered and then a portion of the toluene was removed under vacuum to produce a 10% solution of the boron-containing hydrogen silsesquioxane polymer in toluene. The Mw of the boron-containing hydrogen silsesquioxane polymer was determined to be 9,145 and the PD of the boron-containing hydrogen silsesquioxane polymer was determined to be 2.44, both by GPC.

EXAMPLE 3

Synthesis of $(BO_{3/2})_{0.02}(HSiO_{3/2})_{0.98}$

In a third example preparation, a boron-containing hydrogen silsesquioxane polymer according to an embodiment was prepared as follows. In a 3.0 L jacketed reactor, toluene (180 g), sulfuric acid (92-96%; 75.0 g), and a phase transfer catalyst (1.0 g) were combined and the resulting mixture was stirred for 30 min at room temperature under a nitrogen atmosphere. Then, a mixture of trichlorosilane (60 g, 443 mmoles), boron trichloride (7.7 g of a 1.0 molar (M) solution in toluene; 8.4 mmoles), and toluene (180.0 g) was added dropwise to the mixture in the jacketed reactor. The duration of the dropwise addition was 5 hours. The temperature was kept below 40° C. during the dropwise addition. Once the addition was completed, the mixture was stirred for another hour. The stirring was then stopped and the lower phase was separated from the upper phase. The lower phase was discarded. The upper phase (toluene phase) was washed with water (five washes using 300 g of water each) and then dried over magnesium sulfate. The dried toluene phase was then filtered and then a portion of the toluene was removed under vacuum to produce a 10% solution of the boron-containing hydrogen silsesquioxane polymer in toluene. The Mw of the boron-containing hydrogen silsesquioxane polymer was determined to be 14,330 and the PD of the boron-containing hydrogen silsesquioxane polymer was determined to be 2.83, both by GPC.

EXAMPLE 4

Synthesis of $(BO_{3/2})_{0.03}(HSiO_{3/2})_{0.97}$

In a fourth example preparation, a boron-containing hydrogen silsesquioxane polymer according to an embodiment was prepared as follows. In a 3.0 L jacketed reactor, toluene (180 g), sulfuric acid (92-96%; 75.0 g), and a phase transfer catalyst (1.0 g) were combined and the resulting mixture was stirred for 30 min at room temperature under a nitrogen atmosphere. Then, a mixture of trichlorosilane (58 g, 428 mmoles), boron trichloride (11.5 g of a 1.0 molar (M) solution in toluene; 12.6 mmoles), and toluene (180.0 g) was added dropwise to the mixture in the jacketed reactor. The duration of the dropwise addition was 5 hours. The temperature was kept below 40° C. during the dropwise addition. Once the addition was completed, the mixture was stirred for another hour. The stirring was then stopped and the lower phase was separated from the upper phase. The lower phase was discarded. The upper phase (toluene phase) was washed with water (five washes using 300 g of water each) and then dried over magnesium sulfate. The dried toluene phase was then filtered and then a portion of the toluene was removed under vacuum to produce a 10% solution of the boron-containing hydrogen silsesquioxane polymer in toluene. The Mw of the boron-containing hydrogen silsesquioxane polymer was determined to be 9,700 and the polydispersity (PD) of the boron-containing hydrogen silsesquioxane polymer was determined to be 2.44, both by GPC

EXAMPLE 5

Synthesis of $(BO_{3/2})_{0.05}(HSiO_{3/2})_{0.95}$

In a fifth example preparation, a boron-containing hydrogen silsesquioxane polymer according to an embodiment was prepared as follows. In a 3.0 L jacketed reactor, toluene (540.0 g), sulfuric acid (92-96%; 225.0 g), and a phase transfer catalyst (1.0 g) were combined and the resulting mixture was stirred for 30 min at room temperature under a nitrogen atmosphere. Then, a mixture of trichlorosilane (171.0 g, 1.26 moles), boron trichloride (60.4 g of a 1.0 M solution in toluene; 66 mmoles), and toluene (540.0 g) was added dropwise to the mixture in the jacketed reactor. The duration of the dropwise addition was 5 hours. The temperature was kept below 40° C. during the dropwise addition. Once the addition was completed, the mixture was stirred for another hour. The stirring was then stopped and the lower phase was separated from the upper phase. The lower phase was discarded. The upper phase (toluene phase) was washed with water (five washes using 1,000 g of water each) and then dried over magnesium sulfate. The dried toluene phase was then filtered and then a portion of the toluene was removed under vacuum to produce a 10% solution of the boron-containing hydrogen silsesquioxane polymer in toluene. The Mw of the boron-containing hydrogen silsesquioxane polymer was determined to be 8,200 and the PD of the boron-containing hydrogen silsesquioxane polymer was determined to be 2.37, both by GPC.

The boron-containing hydrogen silsesquioxane polymers obtained in Examples 1-5 above were further processed to prepare respective purified polymers, which were then formulated and tested for film shrinkage and wet etch rate. Details of these procedures are described in detail below, and the material characteristics are set forth in Table 2 in FIG. 4.

The respective boron-containing hydrogen silsesquioxane polymer solutions obtained from Examples 1-5 were subjected to solvent exchange, whereby toluene was replaced by solvents such as methyl isobutyl ketone (MIBK), propylene glycol monomethyl ether acetate (PGMEA), and dibutyl ether (DBE). In some cases, the 10% solution of the boron-containing hydrogen silsesquioxane polymer in toluene was subjected to fractionation in order to remove undesired high and/or low Mw fractions. Where used, the fractionation was performed by adding acetonitrile to the solution and leaving the resulting mixture at room temperature for a period of 2 hours (h) to 20 h. Then, the high Mw fraction that separated from the solution (either as an oil or a gummy solid) was diluted in MIBK and the remaining toluene-acetonitrile solution containing low Mw resin was subjected to solvent exchange with PGMEA or DBE or MIBK to produce a 5% to 20% solution of the boron-containing hydrogen silsesquioxane polymer.

EXAMPLE 6

Fractionation of $(BO_{3/2})_{0.0175}(HSiO_{3/2})_{0.9825}$

A specific example of the above-described purification procedure will now be described. A 14.4% by weight solution of the boron-containing hydrogen silsesquioxane polymer of Example 2 in 200 g of toluene was prepared. The solution was stirred, and acetonitrile (200 g) was added to the stirred solution over a period of 15 min. The solution was stirred for another 30 min and then stirring was stopped. The resulting mixture was left for 20 h at room temperature, over which time a thick oil separated from the solution. The thick oil was diluted in MIBK (70.0 g). The residual acetonitrile and toluene were removed under vacuum to obtain 56.0 g of a 6.0% solution of resin in MIBK. This high Mw fraction represented 11.5% of the overall weight of the resin, and had a Mw of 23,450 and a PD of 1.89.

After purification, the boron-containing hydrogen silsesquioxane polymer obtained in Examples 1-5 above were formulated using additives such as solvents, surfactants, base generators, and crosslinkers, and then spin-coated on a bare silicon wafer or silicon nitride coated silicon wafer.

The coated wafers obtained as described above were subjected to oxidative curing at different temperatures. The curing process had two distinct steps. The first step was a soft baking process in which the coated film was soft baked at temperatures varying from 90° C. to 300° C. under either an oxidative atmosphere such as steam, air, oxygen, or $N_2O$, or an under inert atmosphere.

Note that, during the soft bake process, multiple steps may be performed, e.g., a first bake step may be performed at a lower temperature for a first period of time and then a second bake step may be performed at a higher temperature for a second period of time. Alternatively, the soft bake process may be performed at a single temperature for a predetermined period of time.

In the second step of the curing process, the film, which was soft-baked as described above, was cured at high temperature (400° C. to 1,100° C.) in a furnace. The resulting boron-containing silicon oxide films were analyzed and compared with a dielectric film produced from a commercially available polysilazane material. The results are shown in Table 2 in FIG. 4.

Note that, during the second step of the curing process, the film may be cured under atmospheres such as steam, air, oxygen, hydrogen, nitrogen, $N_2O$, a mixture of nitrogen and $N_2O$, etc. For shallow trench isolation (STI) applications, the maximum curing temperatures may be set to about 900° C. to about 1,100° C. However, for inter layer dielectric (ILD) applications, including pre-metal dielectric (PMD) and inter-metal dielectric (IMD) applications, the maximum curing temperatures may be set to about 400° C. to about 700° C.

Four examples (Examples 7, 8, 9, and 10, corresponding to Examples 1, 3, 4, and 5, respectively) of boron-containing silicon oxide films were analyzed and compared with a commercially-available polysilazane-derived film (produced using AZ® Spinfil® 400 Series from AZ Electronic Materials) (Comparative Example). The results are shown in Table 2 in FIG. 4.

Examples 7-10 and the Comparative Example shown in Table 2 were prepared by curing respective films at a temperature of 800° C. in an atmosphere of water and oxygen. Film shrinkage was determined as the ratio (film thickness prior to thermal processing−film thickness after thermal processing)/(film thickness prior to thermal processing) converted to a percentage. Wet etch rates were determined as the ratio of change in film thickness during etch/etch time. The etchant used to determine wet etch rates was a buffered hydrofluoric acid solution known as Buffer Oxide Etchant (BHF), where a 1:50 solution was used for Examples 7-10 and a 1:100 solution was used for the Comparative Example. The wet etch rates were then used to determine relative wet etch rates, where the relative wet etch rate is the ratio of the wet etch rate of the sample/wet etch rate of a silicon oxide film (where the silicon oxide film was prepared by thermal oxidation using high density plasma (HDP), such an HDP silicon oxide film formed from pure silicon being known in the industry as a reference due to its uniformly dense silicon oxide).

Referring to Table 2, it is apparent that each of Examples 7-10 exhibited significantly less film shrinkage than the Comparative Example. Furthermore, each of Examples 7-10 had a relative wet etch rate that was less than the Comparative Example, i.e., each of Examples 7-10 had a wet etch rate that was closer to that of the reference thermal silicon oxide film than was the wet etch rate of the comparative polysilazane-derived film.

Example embodiments have been disclosed herein, and although specific terms are employed, they are used and are to be interpreted in a generic and descriptive sense only and not for purpose of limitation. For example, embodiments have been described in the context of an integrated circuit device. The integrated circuit device may include, e.g., a semiconductor device, an optoelectronic device, a MEMS device, etc. Accordingly, it will be understood by those of ordinary skill in the art that various changes in form and details may be made without departing from the spirit and scope of the present invention as set forth in the following claims.

What is claimed is:

1. A composition, comprising:
   a base generator; and
   a boron-containing hydrogen silsesquioxane polymer having a structure that includes:
   silicon-oxygen-silicon units, and
   oxygen-boron-oxygen linkages in which the boron is trivalent,
   wherein two of the silicon-oxygen-silicon units are covalently bound by one of the oxygen-boron-oxygen linkages therebetween, and the boron-containing hydrogen silsesquioxane polymer has a cage structure or a partial cage structure.

2. The composition as claimed in claim 1, wherein boron is present in the boron-containing hydrogen silsesquioxane polymer in an amount of about 0.5 to about 5 mol %.

3. The composition as claimed in claim 1, wherein the boron-containing hydrogen silsesquioxane polymer is substantially free of carbon.

4. The composition as claimed in claim 1, wherein the boron-containing hydrogen silsesquioxane polymer is substantially free of nitrogen.

5. The composition as claimed in claim 1, further comprising a solvent.

6. A method of fabricating an integrated circuit, the method comprising:
   providing a substrate for the integrated circuit;
   coating the composition of claim 1 on the substrate; and
   after coating the composition on the substrate, curing the composition.

7. The method as claimed in claim 6, wherein the curing the composition includes heating the substrate having the composition thereon in an oxidizing atmosphere.

8. The method as claimed in claim 6, wherein the curing the composition includes heating the substrate having the composition thereon in an inert atmosphere.

9. The method as claimed in claim 6, wherein the curing the composition on the substrate causes curing byproducts to be emitted from the polymer, the curing byproducts being substantially free of nitrogen.

10. The method as claimed in claim 6, further comprising:
    forming a trench in a surface of the substrate before coating the composition thereon;
    filling the trench with the composition; and
    curing the composition in the trench, thereby forming a shallow trench isolation structure.

11. The method as claimed in claim 10, wherein the curing the composition in the trench includes heating the substrate at a temperature of about 900° C. to about 1,100° C.

12. The method as claimed in claim 6, wherein an interlayer dielectric layer is formed by the curing the composition on the substrate.

13. The method as claimed in claim 12, wherein the curing the composition on the substrate includes heating the substrate at a temperature of about 400° C. to about 700° C.

14. A method of synthesizing a composition comprising a boron-containing hydrogen silsesquioxane polymer having covalently bound trivalent boron therein, the method comprising:
synthesizing the boron-containing hydrogen silsesquioxane polymer comprising:
providing a liquid system having a phase transfer catalyst and first and second phases, the first phase including sulfuric acid and the second phase including an organic solvent;
adding to the liquid system a solution containing an organic solvent, trichlorosilane, and at least one of boron trichloride, boron triiodide, boron tribromide, a trialkyl borate, or boric acid, wherein the boron-containing hydrogen silsesquioxane polymer has a structure that includes:
silicon-oxygen-silicon units, and
oxygen-boron-oxygen linkages in which the boron is trivalent,
wherein two silicon-oxygen-silicon units are covalently bound by an oxygen-boron-oxygen linkage therebetween, and the boron-containing hydrogen silsesquioxane polymer has a cage structure or a partial cage structure; and
adding a base generator to the boron-contain hydrogen silesquioxane polymer to form the composition.

15. The method as claimed in claim 14, wherein the organic solvent in the second phase and the organic solvent in the solution are the same.

16. The method as claimed in claim 14, wherein the organic solvent in the second phase and the organic solvent in the solution are different from each other.

17. The method as claimed in claim 14, wherein the second phase of the liquid system is maintained below a temperature of about 40° C. during the addition of the solution thereto.

18. A composition, comprising:
a base generator; and
a boron-containing hydrogen silsesquioxane polymer having a structure that includes:
a first unit having a cage structure or a partial cage structure formed of silicon-oxygen-silicon bonds; and
a second unit having a cage structure or a partial cage structure formed of silicon-oxygen-silicon bonds,
wherein the first unit and the second unit are linked by an oxygen-boron-oxygen linkage covalently bonded to a silicon atom of the first unit and a silicon atom of the second unit.

19. A method of fabricating an integrated circuit, the method comprising:
providing a substrate for the integrated circuit;
coating the composition of claim 18 on the substrate; and
after coating the composition on the substrate, curing the composition.

* * * * *

UNITED STATES PATENT AND TRADEMARK OFFICE
CERTIFICATE OF CORRECTION

PATENT NO. : 8,613,979 B2
APPLICATION NO. : 13/732990
DATED : December 24, 2013
INVENTOR(S) : Sina Maghsoodi et al.

Page 1 of 1

It is certified that error appears in the above-identified patent and that said Letters Patent is hereby corrected as shown below:

In the Claims

Column 12, Claim 14, line 1        Delete
                                     "boron-contain"
                                   Insert
                                   -- boron-containing --

Column 12, Claim 14, line 2        Delete
                                     "silesquioxane"
                                   Insert
                                   -- silsesquioxane --

Signed and Sealed this
Eleventh Day of November, 2014

Michelle K. Lee
*Deputy Director of the United States Patent and Trademark Office*